(12) United States Patent
Kishida

(10) Patent No.: US 7,112,388 B2
(45) Date of Patent: Sep. 26, 2006

(54) BATTERY PROVIDED WITH TERMINALS

(75) Inventor: Akira Kishida, Ono (JP)

(73) Assignee: Hitachi Maxwell Ltd., Ibaraki (JP)

( * ) Notice: Subject to any disclaimer, the term of this patent is extended or adjusted under 35 U.S.C. 154(b) by 399 days.

(21) Appl. No.: 10/606,293

(22) Filed: Jun. 26, 2003

(65) Prior Publication Data
US 2005/0019654 A1    Jan. 27, 2005

(30) Foreign Application Priority Data
Jun. 27, 2002 (JP) ............ P 2002-188544
Feb. 27, 2003 (JP) ............ P 2003-051763

(51) Int. Cl.
H01M 2/28 (2006.01)
H01M 10/38 (2006.01)
H01M 2/02 (2006.01)

(52) U.S. Cl. .............. 429/121; 429/123; 429/178

(58) Field of Classification Search .......... 429/121, 429/178, 123, 133
See application file for complete search history.

(56) References Cited

U.S. PATENT DOCUMENTS 5,582,933 A    12/1996   Daio et al. ............ 429/178
5,796,588 A  * 8/1998   Machida et al. ........ 361/773

FOREIGN PATENT DOCUMENTS

| JP | 8-153500 A   |   | 6/1996  |
|----|--------------|---|---------|
| JP | 10-064490    | * | 3/1998  |
| JP | 10-64490 A   |   | 3/1998  |
| JP | 2000-323171 A|   | 11/2000 |
| JP | 2003-208886  | * | 7/2003  |

* cited by examiner

Primary Examiner—Patrick Joseph Ryan
Assistant Examiner—Thomas H. Parsons
(74) Attorney, Agent, or Firm—Birch, Stewart, Kolasch & Birch, LLP

(57) ABSTRACT

An electrical apparatus for attaching a battery to a printed circuit board which includes a battery body containing terminals, a portion of each of said terminal defining a fixing portion, a circuit board containing conductive portions and at least one through hole formed therein, wherein the fixing portion of each of the terminals contains at least one engaging portion which lockingly engages the through holes formed in the circuit board or in the vicinity of the through holes and contains a contacting portion which contacts the conductive portion of the circuit board for electrically connecting the battery body to said conductive portion of the circuit board.

7 Claims, 8 Drawing Sheets

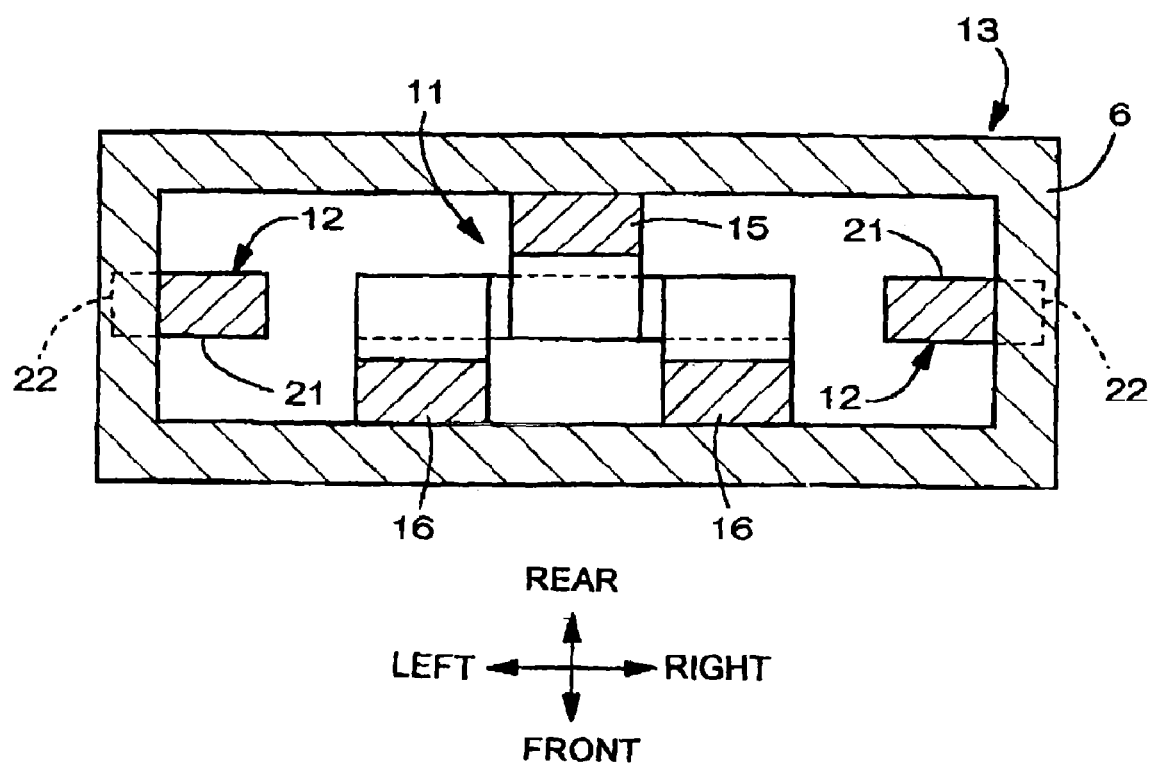

BATTERY PROVIDED WITH TERMINALS

This Nonprovisional application claims priority under 35 U.S.C. 119(a) on Patent Application Nos. 2002-188544 and 2003-051763 filed in Japan on Jun. 27, 2002, and Feb. 27, 2003, the entire contents of which are hereby incorporated by reference.

BACKGROUND OF THE INVENTION

1. Field of the Invention

The present invention relates to a battery provided with terminals, and more particularly, to a battery provided with terminals, capable of being attached to a circuit board of an electronic apparatus without soldering.

2. Description of the Related Art

In a flat battery such as button-shaped and coin-shaped batteries, or square and cylindrical batteries, a primary battery and a secondary battery represented by an alkaline dry battery, a lithium battery, a lithium secondary battery, and an alkaline storage battery are widely used as main power sources, or backup power supplies for memories of various electronic apparatuses.

When mounting the battery on a circuit board of an electronic apparatus, it is suggested that terminals for soldering a battery to the circuit board, should be attached to the battery and that the battery is soldered to the circuit board together with other electronic parts by means of a reflow soldering furnace, in order to improve the efficiency of a manufacturing process.

However, since the battery may be subjected to a high temperature, for example, over 150° C. when the battery is passed through the reflow soldering furnace and heated, even for a short time, a physical change or chemical change occurs in the structure members of the battery, resulting in deterioration of the sealing characteristic, the discharge characteristic, and the cycle characteristic of the battery, which causes a short circuit in the battery. On the other hand, manual soldering application to the batteries, excluding other electronic parts in order to protect the battery, causes significant deterioration of work efficiency. Thus, there is required a high heat resistant battery, whose characteristics are not affected even though the battery passes through the reflow furnace. In particular, a dire need exists to develop a technology for making a high heat resistant lithium battery in which metal lithium with a low melting point is used for a negative electrode and an organic solvent with high volatility is used as an electrolyte solvent.

In order to complete such a need, batteries which use a high heat resistant packing or an additive for improving a storage characteristic at a high temperature, are proposed (Japanese Unexamined Patent Application Publication Tokkai Nos. 8-153500 and 2000-323171). It is possible to improve the heat resistance of a battery by employing the above structure of the battery. Thus, it is possible to obtain a battery capable of passing through the reflow furnace without being damaged.

In addition to, there is proposed a mounting structure for a battery in which the battery is fixed to a circuit board by interposing the circuit board between a battery body and terminals mounted on the battery body in stead of methods for fixing the battery to the circuit board by soldering, which enables the battery to be easily exchanged and repaired (Japanese Unexamined Patent Application Publication No. 10-64490). In accordance with the above method, it is possible to mount the battery on the circuit board without soldering.

However, it has been proven that to make the battery heat resistant causes the following problems. That is, in the former two cases where the packing of the battery is made of a heat resistant material in order to prevent the battery from being damaged when passing through the reflow furnace, the cost of the material significantly increases compared to a material, such as polyolefin, commonly used in a conventional technology. In a case where an additive is included in an electrolyte, since the discharge characteristic of a battery deteriorates more or less, usable electronic apparatuses are restricted. Furthermore, since other structure members should be made of a high heat resistant material even though the additive is added, the cost of the material significantly increases. Since it is required to reduce the amount of the solder used in order to protect the environments due to influences of lead included in solder on environments, it is not preferable to use soldering to conductively connect a battery to a circuit board.

Furthermore, when using the mounting structure in which the circuit board is interposed between the battery body and the terminal mounted on the battery body, since the outer body of the battery directly contacts the conductive portion of the circuit board, the arrangement of the battery is significantly restricted during the mounting of the battery. Thus, it is difficult to compose thin electronic apparatuses and to save the space of the circuit, and it is easy to generate poor connections caused by vibration. Therefore, reliability deteriorates.

SUMMARY OF THE INVENTION

It is a first object of the present invention to provide a battery provided with terminals, which is capable of solving the problems that occur when the battery is mounted on a circuit board of an electronic apparatus and of being mounted on the circuit board without soldering.

It is a second object of the present invention to provide a battery provided with terminals for fixing a battery body in a state of being electrically connected to the conductive portions of the circuit board without soldering.

According to a first aspect of this invention, as shown in FIGS. 1 and 2, a battery includes a battery body 2, and terminals 7 for electrically connecting the battery body 2 to conductive portions 6 provided in a circuit board 5. A portion of each of the terminals 7 is fixing portion 9 for fixing the battery body 2 to the circuit board 5.

Furthermore, engaging portions 12 for engaging a through hole 13 formed in the circuit board 5 and contacting portions 11 contacting the conductive portion 6 to electrically connect the conductive portion 6 to the battery body 2 are provided in the fixing portion 9 of the terminal 7, so that the battery body 2 is electrically connected to the conductive portion 6 in the circuit board 5.

Therefore, according to the invention, when mounting the battery on the circuit board of an electronic apparatus, it is possible to mount the battery body on the circuit board without soldering, by using the battery provided with terminals according to the present invention. Thus, it is possible to reduce the amount of solder used. Since it is not necessary to perform soldering operation, it is possible to mount the battery body on the circuit board with ease and convenience. Furthermore, since it is unnecessary to consider the heat resistance of the battery, it is possible to mount the battery body having an excellent discharge characteristic, which has the same structure as a conventional structure, on the circuit board. Thus, it is possible to improve the operation characteristic of an electronic apparatus.

In a first preferred embodiment according to the invention, the contacting portion 11 and/or the engaging portions 12 have resilient function or spring characteristic, and the contacting portion 11 and/or the engaging portions 12 press the circuit board 5 to fix the battery body 2 on the circuit board.

Further, the engaging portions 12 have locking portions 22 for preventing the battery body 2 from separating from the circuit board 5 by engaging in the through hole 13 of the circuit board 5 or in the vicinity of the through hole 13. The conductive portions 6 may be provided in the through holes 13 formed in the circuit board 5 or around the through hole 13.

According to a second aspect of the present invention, as shown in FIGS. 3 and 4, a battery provided with terminals includes the battery body 2, and terminals 7a and 7b for electrically connecting the battery body 2 to conductive portions 6a and 6b provided in the circuit board 5. A portion of the 20 terminal 7b is fixing portion 9 for fixing the battery body 2 to the circuit board 5. Furthermore, the fixing portion of the terminal 7b comprises clamping or sandwiching portions 34 and 35 for clamping the circuit board 5 in between surfaces of both sides so that a portion of each of the terminals 7a and 7b can fix the battery body 2 to the circuit board 5 sandwiched therebetween. The clamping portions 34 comprise contacting portions, which contact the conductive portions 6b of the circuit board 5 and electrically connect the conductive portions 6b to the battery body 2. The clamping portions 35 may be provided with engaging portions 37, which engage the portions where the conductive portions 6a and 6b of the circuit board 5 are provided, or the portion in the vicinity of the conductive portions when the battery body 2 is mounted on the circuit board 5, thereby preventing the battery body 2 from deviating from the circuit board 5 or from coming out from the circuit board 5.

According to a third aspect of the invention, as shown in FIGS. 5 and 6, a battery provided with terminals includes the battery body 2, and the terminals 7a and 7b for electrically connecting the battery body 2 to the conductive portions 6a and 6b provided in the circuit board 5. The terminals 7a and 7b include contacting portions 42 and 44, which contact the conductive portions 6a and 6b to thus be conductively connected to the conductive portions 6a and 6b, respectively. The through holes 43 and 45 or notches are provided in the contacting portions 42 and 44. The terminals 7a and 7b are fixed to the circuit board 5 by rivets 40 inserted into the through holes 43 and 45, or the notches.

BRIEF DESCRIPTION OF THE DRAWINGS

The above and other objectives and features of the present invention will become more apparent from the following description of a preferred embodiment thereof with reference to the accompanying drawings, throughout which like parts are designated by like reference numerals, and wherein:

FIG. 1 illustrates an example of a battery provided with terminals according to a first aspect of the present invention.

FIG. 2 is a sectional view, which is taken along the line B—B of FIG. 1B;

DESCRIPTION OF THE PREFERRED EMBODIMENTS

Preferred embodiments of the present invention will now be described in detail.

(First Embodiment)

Figure 1A:
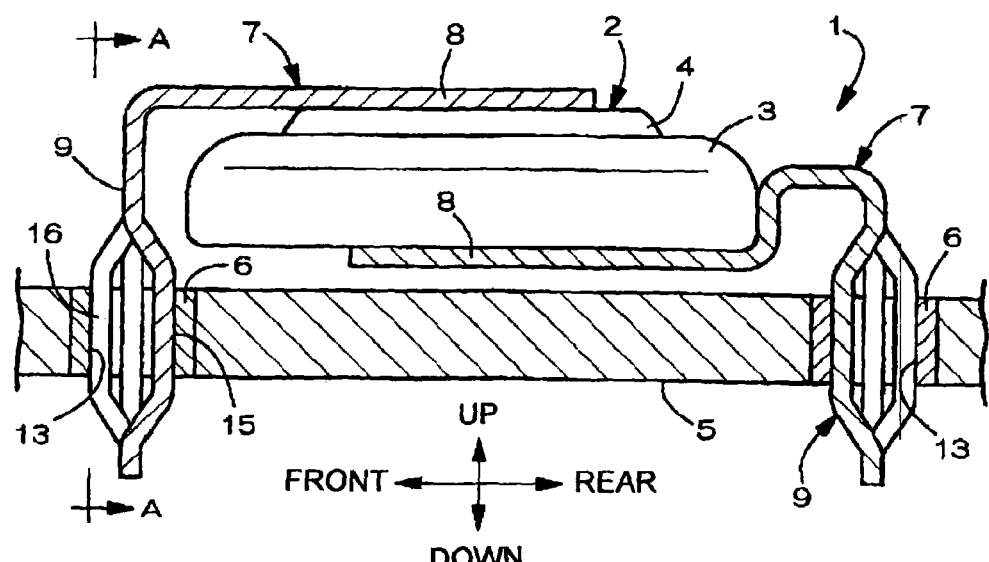
FIG. 1A is a side view of a battery provided with terminals.
Figure 1B:
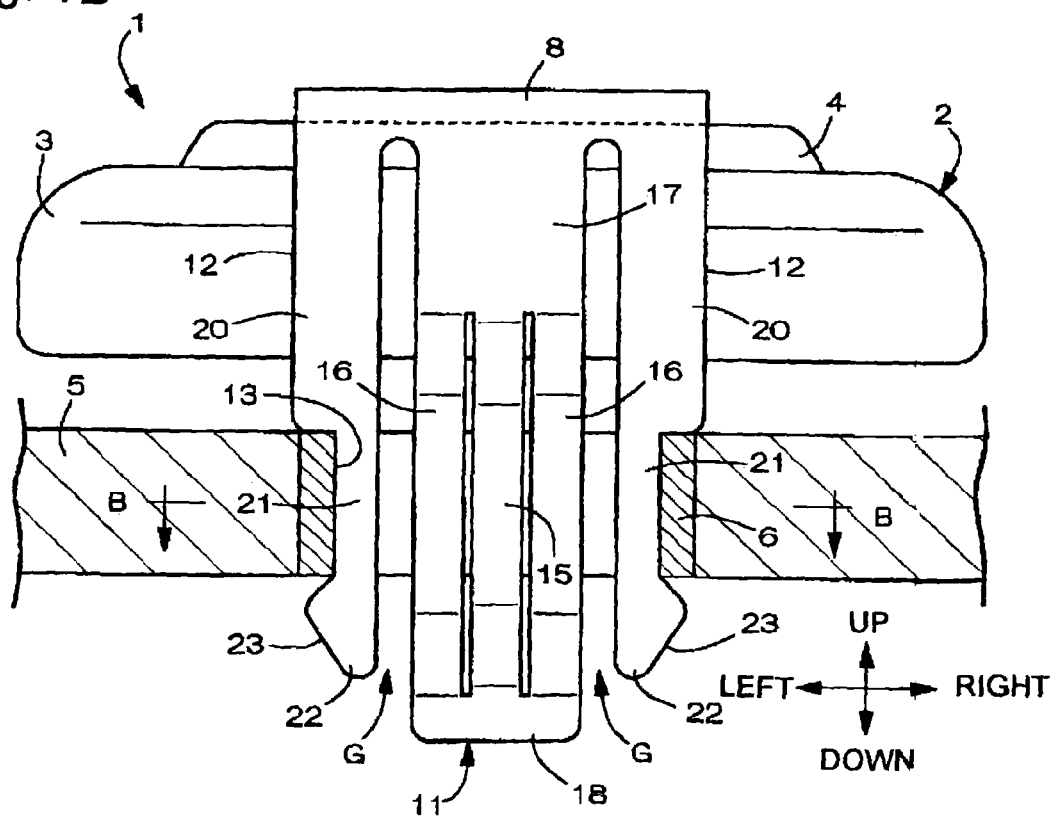
FIG. 1B is a front view of a terminal in a negative electrode, which is taken along the line A—A in FIG. 1A.

A battery provided with terminals according to the present invention will be described with a coin-shaped lithium battery taken as an example. FIG. 1A is a side view of a coin-shaped lithium battery 1. FIG. 1B is a front view of a terminal 7 in a negative electrode, which is taken along the line A—A in FIG. 1A. FIG. 2 is a sectional view, which is taken along the line B—B of FIG. 1B. The coin-shaped lithium battery 1 includes a battery body 2 and terminals 7 welded and fixed to the positive electrode and the negative electrode of the battery body 2. The battery body 2 includes a bottomed cylindrical battery case 3, which has an opening on an upper surface, and a cover 4 for sealing up the opening. The battery case 3 is the positive electrode, and the cover 4 is the negative electrode.

The terminals 7, 7 electrically connect the conductive portions 6 provided in the circuit board 5 to the positive electrode and the negative electrode of the battery body 2, respectively, and fix the battery body 2 to the circuit board 5 so that the battery body 2 does not move. Each terminal 7 is a substantially L shaped press metal fitting, in which horizontal arms 8, welded and fixed to the upper and lower surfaces of the battery body 2 and extended back and forth in a horizontal direction, are integrated with fixing portions 9, bent and curved downward from the free ends of the horizontal arms 8.

As shown in FIGS. 1 and 2, each fixing portion 9 includes a central main resilient arm (a contacting portion) 11, which is extended downward in an overhung style from the bent portion of the horizontal arm 8, and a pair of auxiliary resilient arms (engaging portions) 12, which are extended downward in the overhung style so as to sandwich the main resilient arm and are capable of being elastic-deformed from side to side. The main resilient arm 11 and the auxiliary resilient arms 12 are inserted into the through holes 13 provided in the circuit board 5. Thus, the fixing portions 9 contact the conductive portions 6 formed on the internal walls of the through holes 13 to thus electrically connect the conductive portions 6 to the positive electrode and the negative electrode of the battery body 2. Furthermore, the fixing portions 9 protrude from the circuit board 5 to thus fix the battery body 2, so that the battery body 2 does not move.

As shown in FIG. 2, the through holes 13 are a rectangle that is long in the right and left directions and short in the forth and rear directions, as seen in a plane. All over the inner circumferential surface of the through holes 13 is straight such that the sizes of upper and lower paths are equal to each other. The conductive portion 6 is formed all over the internal circumferential surface of the through hole 13.

As shown in FIGS. 1 and 2, the main resilient arm 11 includes a resilient metal plate 15 formed to be swollen toward the side of the battery body 2, that is, backward and capable of being elastic-deformed back and forth, and resilient metal plates 16 formed to be swollen forward and capable of being elastic-deformed back and forth. The resilient metal plates 15 and 16 are supported between an upper extended base end 17 and a lower extended base end 18 in a center impeller. The distance between the resilient metal plates 15 and 16 in the front and rear directions, in which the resilient metal plate 15 faces the resilient metal plates 16, is set to be slightly larger than the length of the path of the through hole 13 in the front and rear directions. Therefore, when the resilient metal plates 15 and 16 are inserted into the through hole 13, the resilient metal plates 15 and 16 pressingly contact the front and rear walls of the through hole 13.

The auxiliary resilient arms 12 include a base ends 20 extended downward from an upper end, a thin portion 21 formed by thinning the right and left external wall surfaces of the base ends 20, and a locking portions 22 integrated with the extended end of the thin portions 21 and protruding outward in the right and left directions. The right and left external wall surfaces of the locking portions 22 are taper-shaped guide surfaces 23 of which an upper portion is wider. The auxiliary resilient arms 12 are extended from right and left external positions of the extended base end 17 of the main resilient arm 11. Furthermore, a deformation gap G is secured between the right and left internal surfaces of the auxiliary arms 12 and the external surfaces of the main resilient arm 11 which face the internal surfaces, so that the auxiliary resilient arms 12 are elastic-deformed in right and left inward directions (in the direction of the main resilient arm 11). That is, the auxiliary resilient arms 12 closely face the main resilient arm 11 through a little gap. Thus, the auxiliary resilient arms 12 can be elastically deformed from side to side and be independent from the main resilient arm 11.

As shown in FIG. 1B, the distance between the right and left external wall surfaces of the thin portion 21 is set to be substantially equal to the distance between the right and left internal wall surfaces of the through hole 13, wherein the right and left internal wall surfaces face each other. Therefore, the locking portions 22 protrude outward from side to side compared to the internal wall surface of the through hole 13 by as much a thickness difference between the locking portion 22 and the thin portion 21 in the right and left directions. The up and down distance between the base end 20 and the locking portion 22, that is, the up and down distance of the thin portion 21 is set to be substantially equal to the thickness of the circuit board 5 at the peripheral edge of the through hole 13.

How to mount the battery provided with terminals 1 will now be described. When the auxiliary resilient arms 12 are concentrically inserted into the through hole 13 while contacting the guide surfaces 23 of the locking portions 22 to the upper ends of the right and left internal walls of the through hole 13, the auxiliary resilient arms 12 are elastically deformed in the direction of the deformation gap G. In the state in FIG. 1B where the fixing portion 9 is completely inserted into the through hole 13, the locking portions 22 protrude from side to side from the through hole 13 by the elastic resilience of the auxiliary resilient arm 12. Thus, the locking portions 22 are engaged with the circuit board 5 related to the peripheral edge of the lower end of the through hole 13. It is possible to prevent the terminal 7 from carelessly coming out from the through hole 13 by engaging the locking portions 22 with the circuit board 5 at the peripheral edge of the lower end of the through hole 13. That is, it is possible to prevent the terminal 7 from coming out upward by the auxiliary resilient arms 12 being caught in the circuit board 5 related to the peripheral edge of the through hole 13.

Also, when the auxiliary resilient arms 12 are inserted into the through hole 13, the up and down movement of the terminal 7 is restricted within the vertical length of the thin portion 21. To be specific, the step parts between the thin portions 21 and the base ends 20 are caught in the circuit board 5 at the peripheral edge of the upper end of the through hole 13. Thus, the terminal 7 can be firmly inserted into the through hole 13 without sinking downward. Furthermore, since the locking portions 22 are engaged with the circuit board 5 at the peripheral edge of the lower end of the through hole 13, it is possible to prevent the terminal 7 from coming out upward. As a result, it is possible to prevent the terminal 7 from carelessly coming out from the through hole 13 or from deviating from the through hole 13 due to an external shock inflicted on the terminal 7. Moreover, since the right and left external surfaces of the thin portions 21 contact the right and left internal wall surfaces of the through hole 13, the terminal 7 does not deviate from side to side.

In addition, since the auxiliary resilient arms 12 can be elastically deformed, after the locking portions 22 are inserted into the through hole 13, the locking portions 22 can be penetrated and engaged with the through hole 13 while sliding along the right and left side surfaces of the through hole 13 by pushing the terminal 7 into the through hole 13. Thus, it is possible to easily insert the battery provided with terminals 1 into the through hole 13. If necessary, the battery provided with terminals 1 can be easily detached from the through hole 13 in the reverse order. That is, when the battery provided with terminals 1 is detached from the circuit board 5, the locking portions 22 of the auxiliary resilient arms 12 are caught by the ends of fingers and are bent toward the main resilient arm 11 to thus release the engagement of the locking portion 22 with the circuit board 5. Then, the terminal 7 is lifted upward.

When the terminal 7 is concentrically inserted into the through hole 13, the resilient metal plates 15 and 16, which form the main resilient arm 11, are elastically deformed so that the distance in the front and rear directions between the resilient metal plates 15 and 16, in which the resilient metal plate 15 faces the resilient metal plates 16, is reduced. In reference to the state in FIGS. 1A and 2, at the location where the fixing portion 9 is completely concentrically inserted into the through hole 13, the main resilient arm 11 is pressed to and engaged with the internal wall surface in the front and rear directions of the through hole 13 by the elastic resilience of the resilient metal plates 15 and 16. Electrical conduction between the terminal 7 and the conductive portion 6 is secured and it is possible to prevent the terminal 7 from deviating in the front and rear directions due to the pressing engagement between the resilient metal plates 15 and 16 and the internal wall surface of the through hole 13.

(Second Embodiment)

Figure 3A:
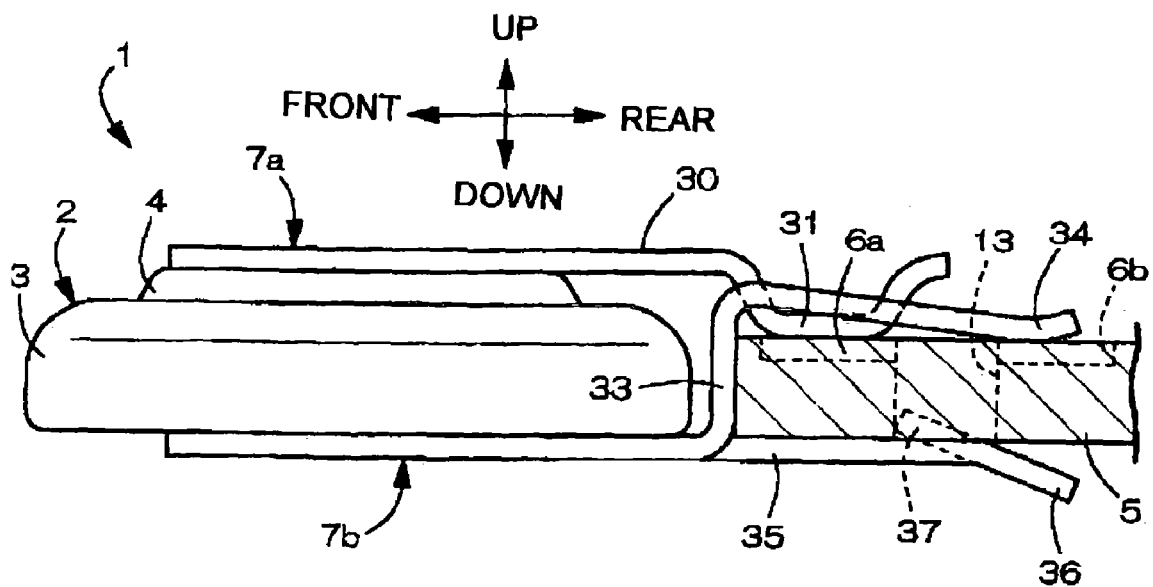
FIG. 3A is a side view of a battery provided with terminals according to a second embodiment of the present invention.
Figure 3B:
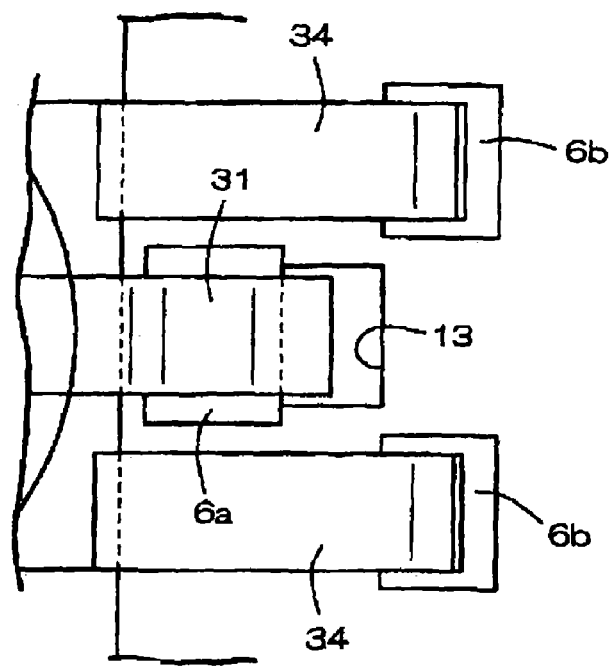
FIG. 3B is a top view of a circuit board seen from above.
Figure 4:
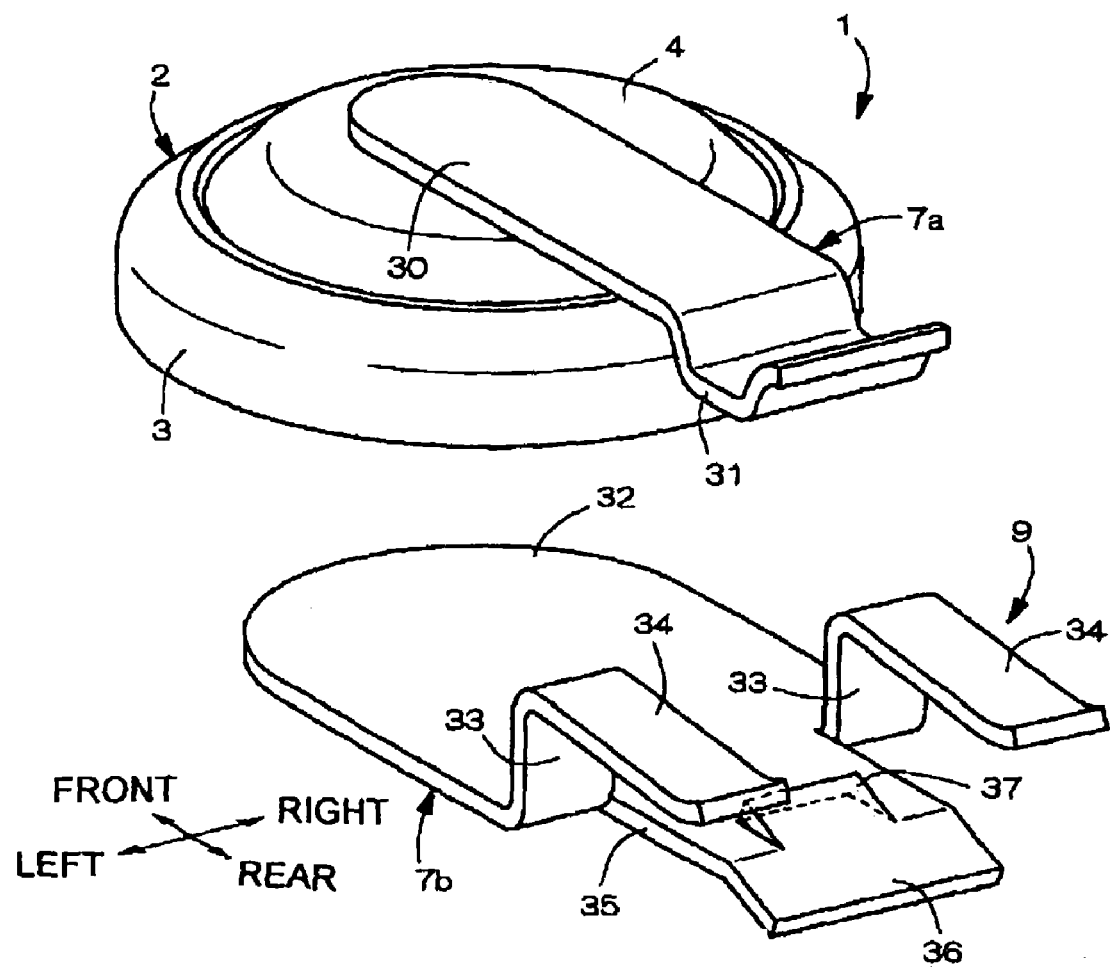
FIG. 4 is an exploded perspective view of the battery provided with terminals according to the second embodiment of the present invention.

A second embodiment of the battery provided with terminals, according to the present invention, is shown in FIGS. 3 and 4. In this case, the battery provided with terminals 1 includes the battery body 2, a negative electrode terminal 7a, that is welded and fixed to the upper surface of the battery body 2, and an positive electrode terminal 7b, that is welded and fixed to the lower surface of the battery body 2. The battery provided with terminals 1 is mounted in and fixed to the peripheral edge of the circuit board 5.

The negative electrode terminal 7a is a press metal fitting in which a horizontal arm 30, extending backward, is integrated with a contacting portion 31, which is formed by bending it in a V-shape in the free end of the horizontal arm 30, to contact the conductive portion 6a of the circuit board 5. The base end of the horizontal arm 30 is welded and fixed to the upper surface of the battery body 2. The contacting portion 31 with the conductive portion 6a is flat.

In FIG. 4, the positive electrode terminal 7b is a press metal fitting in which a base wall 32 supporting the lower surface of the battery body 2, a pair of right and left supporting arms 33, that is turned upward from the right and left sides of the rear end of the base wall 32, an upper engaging arm 34, that is extended from the upper end of the supporting arm 33 and bent downward on the tilt, a lower engaging arm 35, that is extended backward from the center of the rear end of the base wall 32, and a releasing piece 36, that is bent downward on the tilt from the free end of the lower engaging arm 35, are integrated with each other. The battery body 2 is welded and fixed to the upper surface of the base wall 32. A fixing protrusion (an engaging portion) 37 is cut and raised on the upper surface of the lower engaging arm 35. The distance between the supporting arms 33, in which the right and left supporting arms 33 face each other, is set to be larger than the right and left widths of the negative electrode terminal 7a. The distance between the upper engaging arm 34 and the lower engaging arm 35, in which the upper engaging arm 34 faces the lower engaging arm 35, is set to be a little smaller than the thickness of the circuit board 5. The upper and lower engaging arms 34 and 35 can be elastically deformed up and down a little. The fixing portions and the clamping portions according to the present invention are composed of the engaging arms 34 and 35.

In FIGS. 3A and 3B, a reference numeral 13 denotes a substantially rectangular through hole, which is provided around the peripheral edge of the circuit board 5. The negative electrode conductive portion 6a is provided on the upper surface of the circuit board 5 between the through hole 13 and the peripheral edge of the circuit board 5. The positive electrode conductive portions 6b are provided on the right and left sides of the negative electrode conductive portion 6a. That is, the positive and negative electrode conductive portions 6a and 6b are provided on the upper surface of the circuit board 5 to be parallel to each other from side to side. The distance between the right side and left side of the through hole 13 is set to be slightly larger than the length of the protrusion 37.

In the battery provided with terminals 1 having the above structure, the battery 1 is mounted on the circuit board 5 by interposing the circuit board 5 between the upper engaging arms 34 and the lower engaging arm 35 of the positive electrode terminal 7b. That is, the battery 1 is mounted on the circuit board 5 by clamping the circuit board 5 between the upper and lower engaging arms 34 and 35 in the up and down directions in a clip state. At this time, the battery 1 is fixed to the circuit board by resilient force of the engaging arms 34 and 35, and the upper engaging arms 34 contacts the conductive portions 6b. Thereby, the positive electrode of the battery body 2 is conductively connected to the circuit board 5. At the same time, the fixing protrusion 37 provided on the lower engaging arm 35 is inserted into the through hole 13, which is provided in the circuit board 5. Thus, the battery 1 is engaged to the circuit board 5, thereby preventing the battery 1 from coming out from the circuit board 5. Meanwhile, the contacting portion 31 of the negative electrode terminal 7a contacts the conductive portion 6a so that the negative electrode of the battery body 2 is conductively connected to the circuit board 5.

When the battery provided with terminals 1 is detached from the circuit board 5, the releasing piece 36 of the lower engaging arm 35 is caught by the ends of fingers to bend the lower engaging arm 35 downward. Next, the engagement of the protrusion 37 to the through hole 13 is released. Then, the battery 1 is taken out in a forward direction.

(Third Embodiment)

Figure 5:
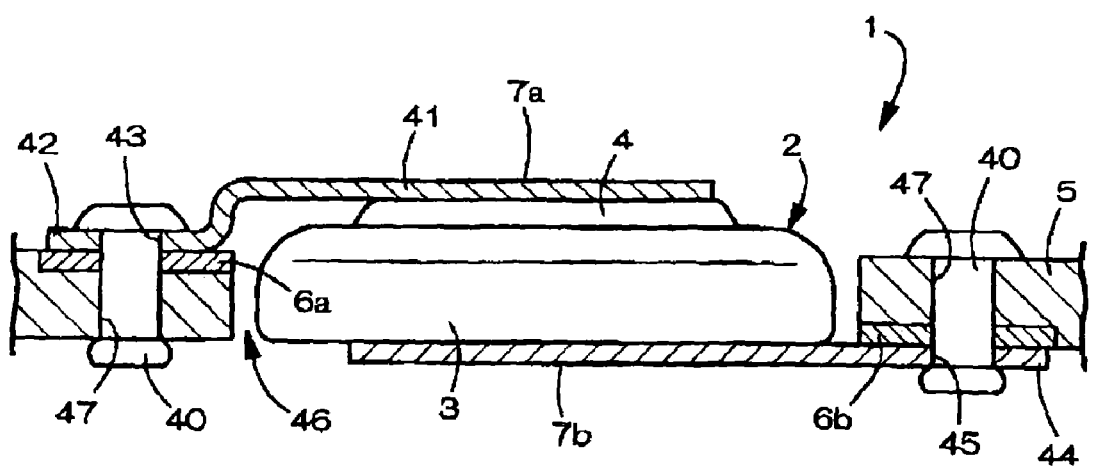
FIG. 5 is a side view of a battery provided with terminals according to a third embodiment of the present invention.
Figure 6:
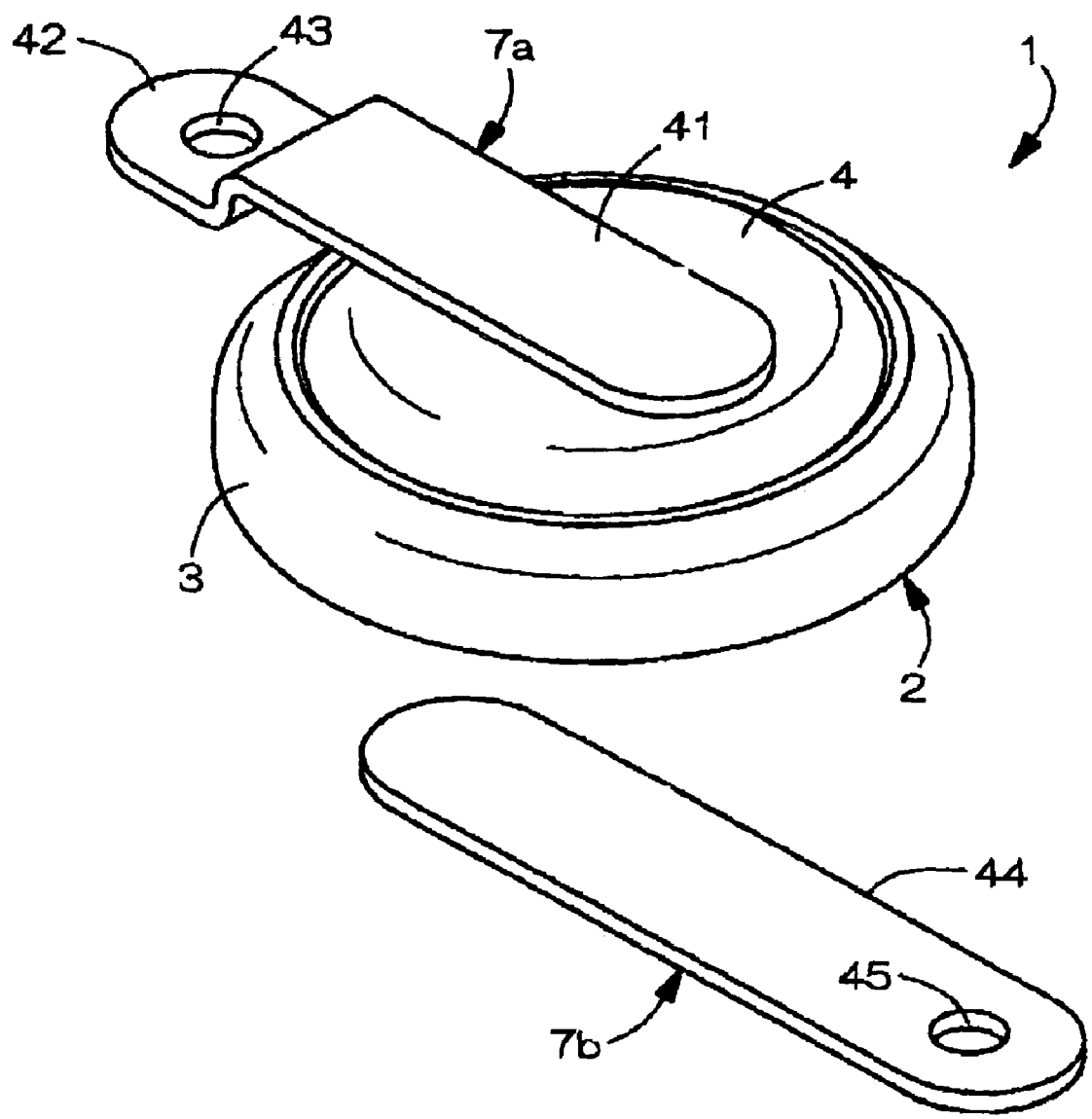
FIG. 6 is an exploded perspective view of the battery provided with terminals according to the third embodiment of the present invention.

A third embodiment of the battery provided with terminals according to the present invention is shown in FIGS. 5 and 6. The battery provided with terminals 1 includes the battery body 2, a negative electrode terminal 7a which is welded and fixed to the upper surface of the battery body 2, and a positive electrode terminal 7b which is welded and fixed to the lower surface of the battery body 2. The battery 1 is fixed to and mounted on the circuit board 5 using rivets 40.

The negative electrode terminal 7a is a press formed product obtained by bending a horizontal portion 41 which is extended outward from the battery body 2, and a backing plate (a contacting portion) 42, which is fixed to the circuit board 5 by rivet in the shape of steps. A through hole 43 for the rivet 40 is formed in the center of the backing plate 42. The positive electrode terminal 7b is a long flat metal plate, and a through hole 45 for the rivet 40 is provided in the center of a free end (a contacting portion) 44.

A battery chamber 46 for holding the battery body 2 is disposed to penetrate the circuit board 5. The conductive portions 6a and 6b are buried on the surfaces of the circuit board 5 related to the peripheral edge of the battery chamber 46 facing the positive electrode and negative electrode terminals 7a and 7b. The through holes 47 for the rivets 40 are formed in the conductive portions 6a and 6b and the circuit board 5 corresponding thereto.

When mounting and fixing the battery provided with terminals 1 onto the circuit board, firstly, the positive electrode terminal 7b is inserted into the battery chamber 46 and the battery 1 is temporarily assembled on the circuit board 5. Then, the through holes 43, 45 and 47 of the terminals 7a and 7b and the conductive portions 6a and 6b are arranged, and then the rivets 40 are inserted into the through holes 43, 45 and 47. Next, the sharp ends of the rivets 40, which protrude from the through holes 43 and 44, are made flat. As a result, the terminal 7a and 7b are fixed to the circuit board 5 with caulking. At this time, the conductive portions 6a and 6b provided on the circuit board 5 contact the backing plate 42 and the free end 44 of the terminals 7a and 7b, respectively. Therefore, the battery body 2 is conductively connected to the circuit board 5.

(Fourth Embodiment)

Figure 7:
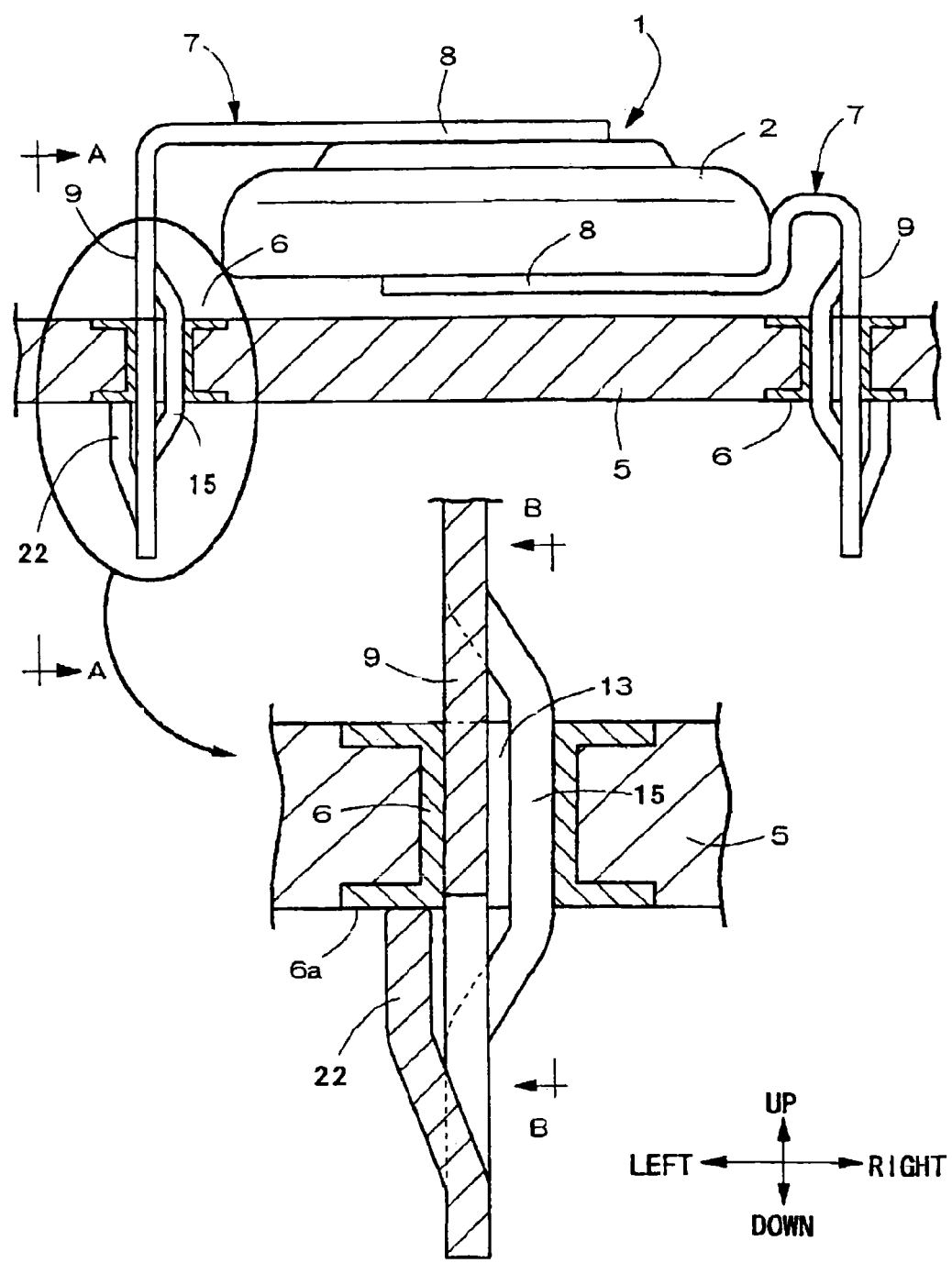
FIG. 7 is a side view of a battery provided with terminals according to a fourth embodiment of the present invention, wherein an A—A line sectional part of the connecting portion is enlarged.
Figure 8:
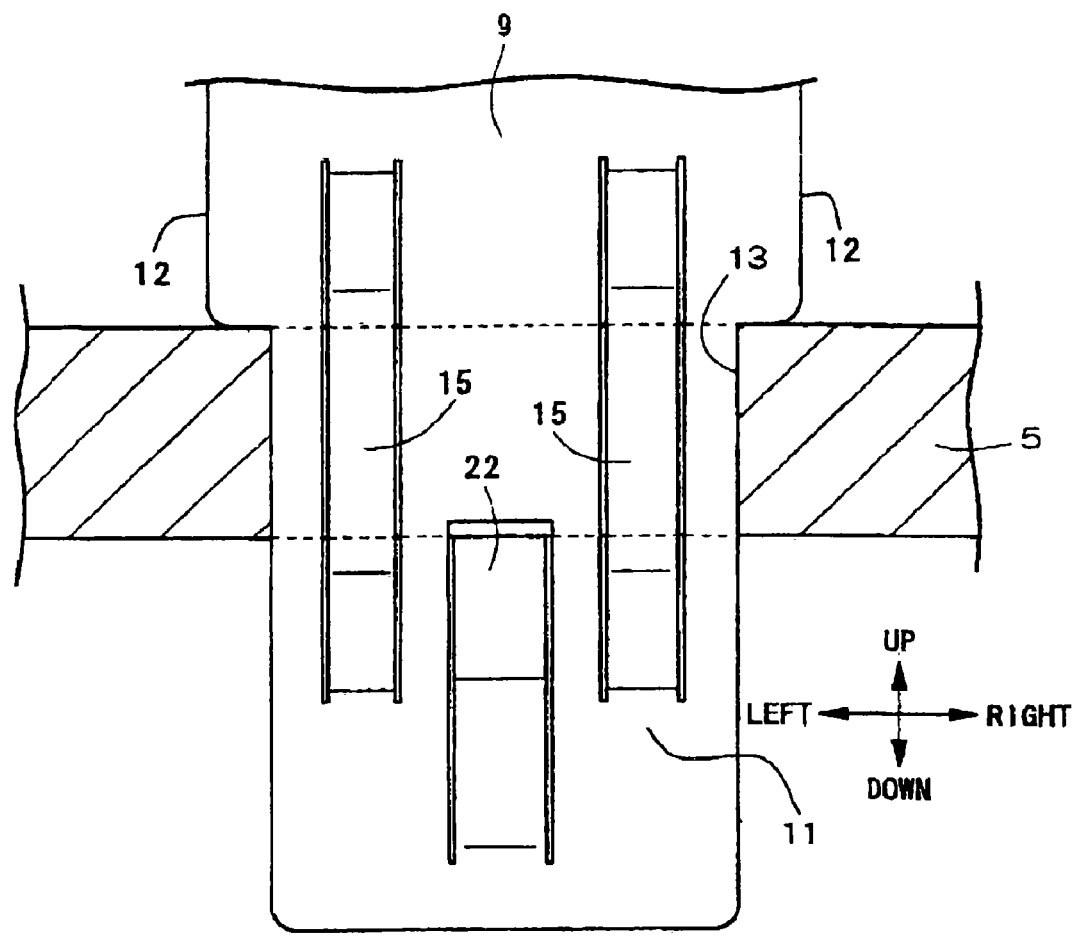
FIG. 8 is a front view of a terminal in the negative electrode, which is taken along the line B—B in FIG. 7.

A fourth embodiment of the battery provided with terminals according to the present invention is shown in FIGS. 7 and 8. In this embodiment, the fixing portion 9 of terminals 7, 7 is designed to have an engaging portion 12 including a contacting portion 11. In detail, the contacting portion 11 is designed to include a pair of resilient plates 15 and 15, between which an auxiliary resilient arm is positioned and designed to work as a locking portion 22. The same numbers indicate the same function portions as in the first embodiment, so that the detailed explanation is omitted and the first embodiment should be made reference.

According to the present embodiments, the positive electrode terminal and the negative electrode terminal both have the terminal structure of the present invention. However, either the positive electrode terminal or the negative electrode terminal may have the above structure. Also, the arrangement of the battery is not restricted to that mentioned above.

According to the present invention, the material of the terminal is not restricted, but may be metal such as steel, copper, nickel, aluminum and titan, or an alloy thereof (stainless steel and brass), or a compound of a plurality of materials such as a clad plate of the above member. Furthermore, the surface of the terminal may be plated with tin, solder, copper, gold and the like. When mounting the terminal on the external can of the battery by welding, it is preferable to select the material of the terminal in consideration of the characteristic of welding against the external can. When the external can is stainless steel, it is preferable that the material of terminal be stainless steel or nickel. When the external can is aluminum or an aluminum alloy, it is preferable that the material of terminal be aluminum or an aluminum alloy.

What is claimed is:

1. An electrical apparatus for attaching a battery to a printed circuit board which comprises:
    a battery body containing terminals, a portion of each of said terminal defining a fixing portion,
    a circuit board containing conductive portions and at least one through hole formed therein, wherein
    the fixing portion of each of the terminals contains at least one engaging portion which lockingly engages the through holes formed in the circuit board or in the vicinity of the through holes and contains a contacting portion which contacts the conductive portion of the circuit board for electrically connecting the battery body to said conductive portion of the circuit board.

2. The electrical apparatus for attaching a battery to a printed circuit board according to claim 1, wherein the contacting portion and/or the engaging portion have resilient functions, whereby the battery body is fixed in such a state that the circuit board is pressed by the contacting portion and/or the engaging portion.

3. The electrical apparatus for attaching a battery to a printed circuit board according to claim 1, wherein the engaging portion is designed so as to include the contacting portion or portions.

4. An electrical apparatus for attaching a battery to a printed circuit board which comprises:
    a battery body,
    a circuit board containing conductive portions,
    a pair of terminals, which electrically connect the battery body to said conductive portion of the circuit board, wherein
    a portion of one of the terminals contains clamping portions, which clamp the circuit board from surfaces of both sides and .an other portion of the terminal receives the battery body, and contacts the conductive portion of the circuit board for electrically connecting the battery body to said conductive portion of the circuit board.

5. The electrical apparatus for attaching a battery to a printed circuit board according to claim 4, wherein at least one of the clamping portions is provided with an engaging portion, which engages a portion where the conductive portion of the circuit board is provided or a portion around the conductive portion when the battery body is mounted on the circuit board.

6. An electrical apparatus for attaching a battery to a printed circuit board which comprises:
    a battery body,
    a circuit board containing conductive portions,
    a pair of terminals, which electrically connect the battery body to said conductive portion of the circuit board, wherein
    each of the terminals comprises a contacting portion in contact with a conductive portion of the circuit board to be electrically connected thereto, and each of the contacting portions includes a through hole or a notch, into which a rivet is inserted to make each terminals fixed to the circuit board, whereby the battery body is fixed in a state of being electrically connected to the conductive portions of the circuit board.

7. The electrical apparatus for attaching a battery to a printed circuit board according to claim 1, 4 and 6, wherein the battery comprises metal lithium used for a negative electrode and an organic solvent with high volatility used as an electrolyte solvent.

* * * * *

UNITED STATES PATENT AND TRADEMARK OFFICE
CERTIFICATE OF CORRECTION

| | |
|---|---|
| PATENT NO. | : 7,112,388 B2 |
| APPLICATION NO. | : 10/606293 |
| DATED | : September 26, 2006 |
| INVENTOR(S) | : Akira Kishida |

It is certified that error appears in the above-identified patent and that said Letters Patent is hereby corrected as shown below:

Title page, should read as follows:
Item --[73]   Assignee:   Hitachi Maxell Ltd.   Ibaraki, JP--

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,112,388 B2 Page 1 of 1
APPLICATION NO. : 10/606293
DATED : September 26, 2006
INVENTOR(S) : Akira Kishida It is certified that error appears in the above-identified patent and that said Letters Patent is hereby corrected as shown below:

<u>Title page, item [73]</u>:

The Assignee's name "Hitachi Maxwell Ltd." should be changed to --Hitachi Maxell Ltd.,--

Signed and Sealed this

Twenty-fifth Day of November, 2008

JON W. DUDAS
*Director of the United States Patent and Trademark Office*